(12) United States Patent
Asakura et al.

(10) Patent No.: US 7,034,750 B2
(45) Date of Patent: *Apr. 25, 2006

(54) ANTENNA MOUNTING PRINTED-CIRCUIT BOARD

(75) Inventors: Kenji Asakura, Neagari-machi (JP); Hidenobu Muranaka, Neagari-machi (JP); Shuichiro Yasuda, Neagari-machi (JP)

(73) Assignees: Sony Corporation, Tokyo (JP); Sony Chemicals Corporation, Tokyo (JP)

(*) Notice: Subject to any disclaimer, the term of this patent is extended or adjusted under 35 U.S.C. 154(b) by 83 days.

This patent is subject to a terminal disclaimer.

(21) Appl. No.: 10/694,598

(22) Filed: Oct. 27, 2003

(65) Prior Publication Data
US 2004/0119653 A1 Jun. 24, 2004

(30) Foreign Application Priority Data
Oct. 30, 2002 (JP) ............................ 2002-316544

(51) Int. Cl.
*H01Q 1/38* (2006.01)
(52) U.S. Cl. .................. 343/700 MS; 343/702
(58) Field of Classification Search ............ 343/702, 343/846, 895, 700 MS
See application file for complete search history.

(56) References Cited

U.S. PATENT DOCUMENTS

| 5,861,854 | A  | * | 1/1999  | Kawahata et al. ........... 343/702 |
| 6,476,767 | B1 | * | 11/2002 | Aoyama et al. ....... 343/700 MS |
| 6,707,427 | B1 | * | 3/2004  | Konishi et al. ....... 343/700 MS |
| 2004/0145528 | A1 | * | 7/2004 | Mukai et al. ................ 343/702 |

FOREIGN PATENT DOCUMENTS

| JP | H05-347509 | 12/1993 |
| JP | 2002-118411 | 4/2002 |

* cited by examiner

*Primary Examiner*—Shih-Chao Chen
(74) *Attorney, Agent, or Firm*—Welsh & Katz, Ltd.

(57) ABSTRACT

A chip-like printed antenna in which an open end is formed by at least two antenna conductors separated from each other is mounted on a printed-circuit board. A ground required by one or plural other modules is disposed and mounted on the printed-circuit board so as to surround a remaining area of a surrounding area of the printed antenna except a partial area as indicated by oblique line parts. By this, in the printed-circuit board, a radiation electric field does not come to have a dipole mode, but is formed into a balloon shape and is radiated in one direction as indicated by a broken line.

5 Claims, 18 Drawing Sheets

F I G . 10A
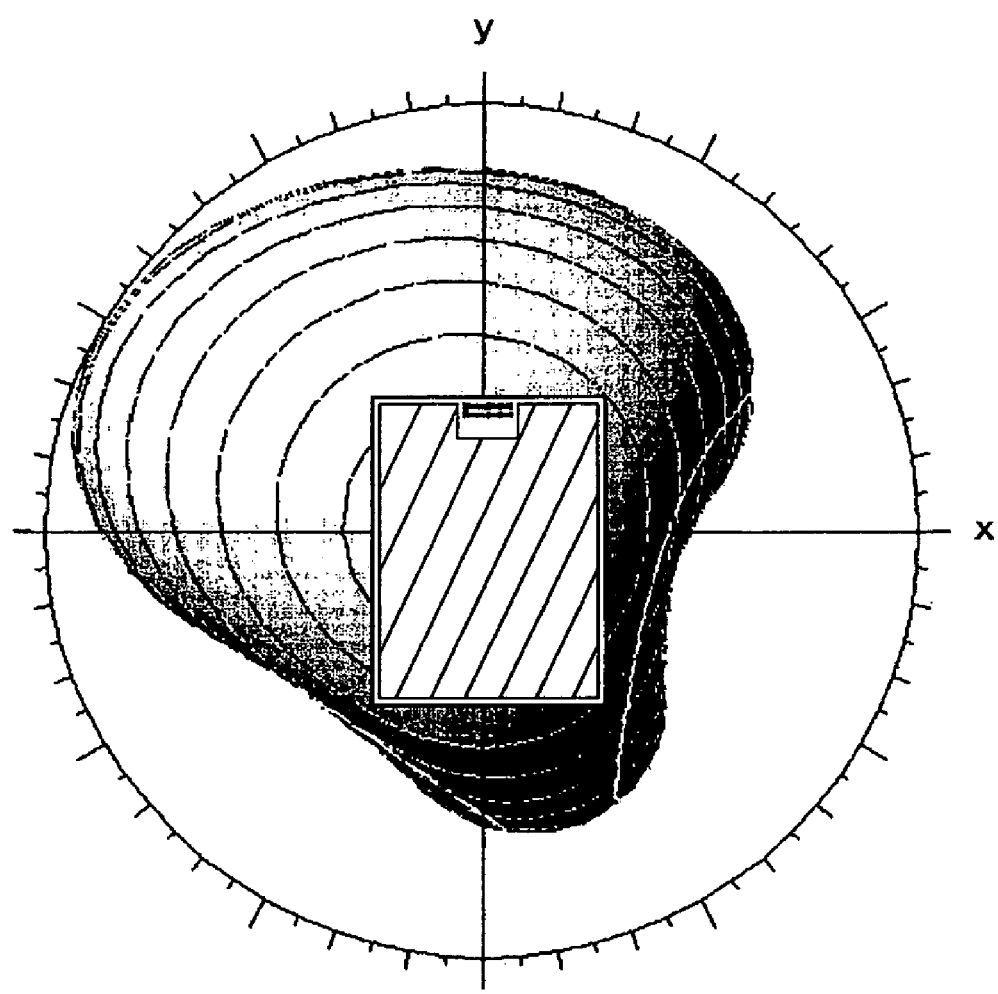

F I G . 12
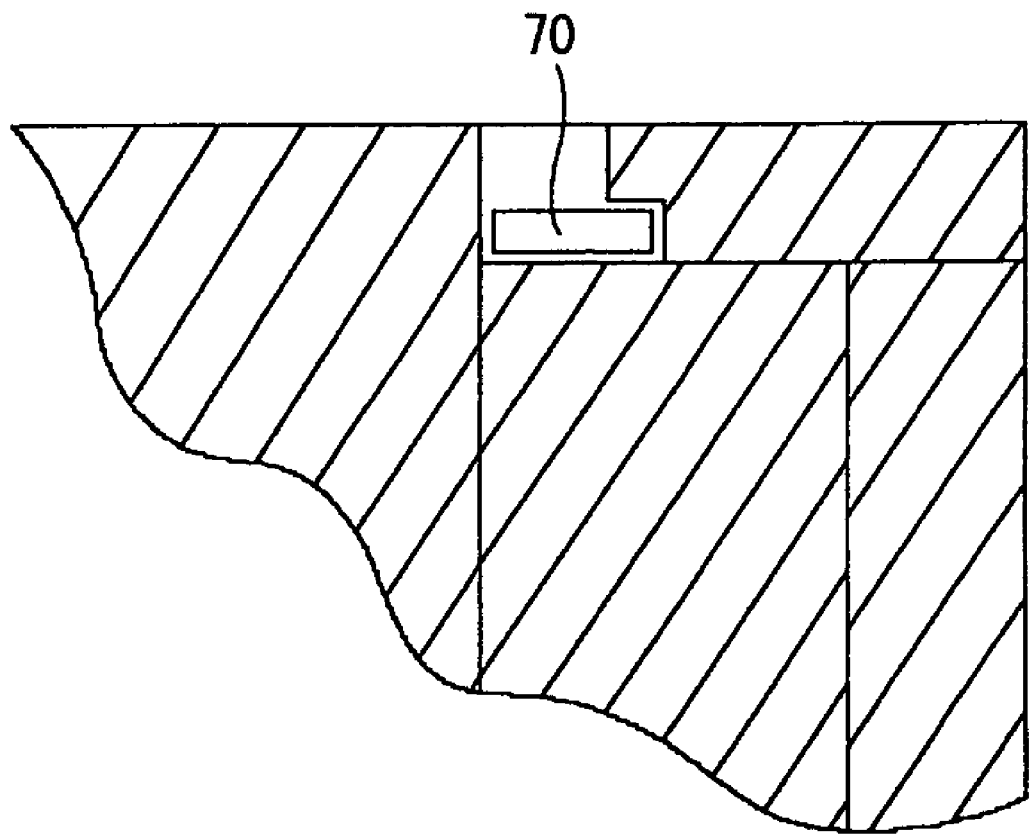

F I G . 13
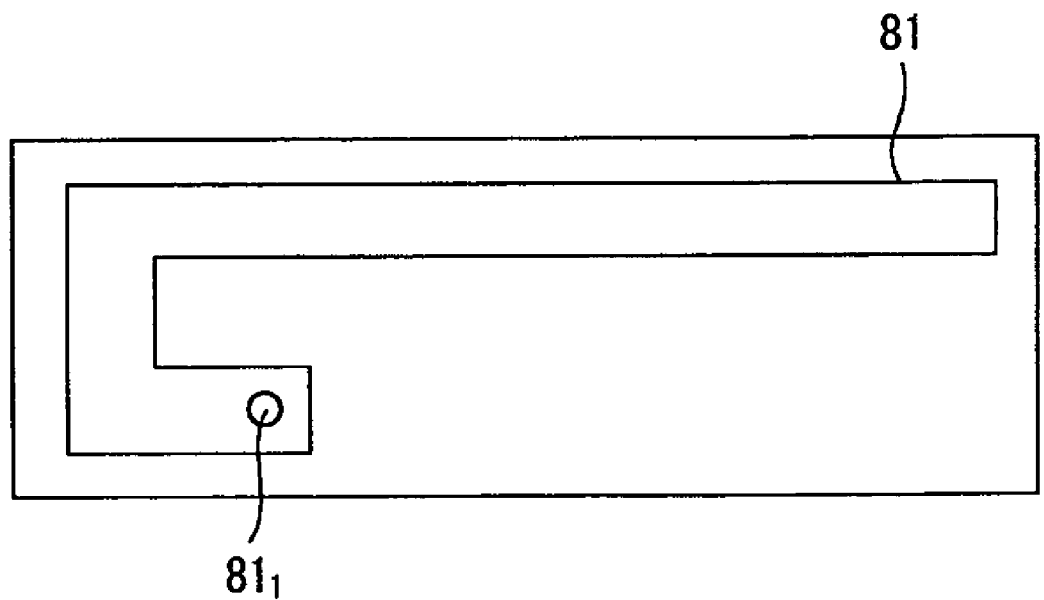

F I G . 16
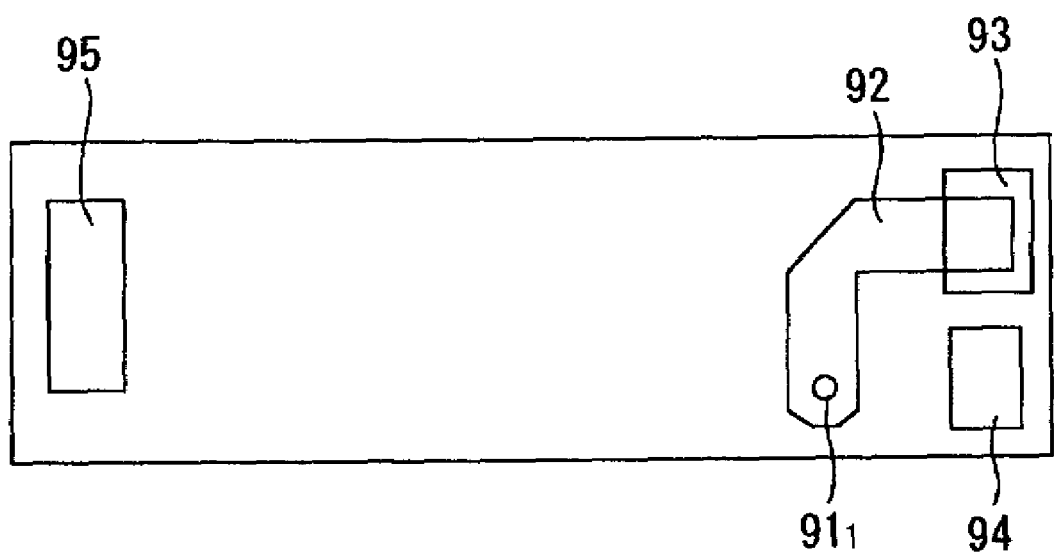

ANTENNA MOUNTING PRINTED-CIRCUIT BOARD

BACKGROUND

1. Technical Field

The present invention relates to an antenna mounting printed-circuit board which is incorporated in an equipment having at least a communication function and mounts thereon various modules for realizing various functions.

2. Technical Art

In recent years, for example, like a mobile communication unit such as a cellular phone, or a wireless LAN (Local Area Network) based on the so-called IEEE (Institute of Electronic and Electronics Engineers) 802.11 standard, various wireless communication techniques have been remarkably developed, and in accordance with this, various techniques concerning an antenna element as an inevitably provided member to perform wireless communication have also been developed.

As an antenna element, for example, one in which a radiation electrode, a surface electrode or the like is formed on a cylindrical dielectric is known. This kind of antenna element is generally installed at the outside of an equipment body and is used. However, in the antenna element of such a type that it is disposed at the outside and is used, there are problems that miniaturization of the equipment is obstructed, high mechanical strength is required, and the number of parts is increased.

Then, as an antenna element substituting for this, a chip-like antenna element which can be surface-mounted on a printed-circuit board provided in the inside of an equipment body has been proposed.

As the chip-like antenna element, various ones have been proposed, for example, a so-called reverse F-type antenna in which a conductor as a radiation electrode is formed into a reverse F shape, or a so-called helical antenna in which a conductor is formed into a coil shape. In such a chip-like antenna element, what is formed by using a high dielectric constant material, such as ceramic, as abase member is typical. However, in this kind of antenna element, there are defects that the high dielectric constant material itself is expensive, and the processing thereof is troublesome, and there are problems that the productivity lowers and the manufacture cost increases.

Then, in recent years, with the improvement of a photo-etching technique, for the purpose of resolving the disadvantages as stated above, a so-called printed antenna is proposed in which a printed-circuit board having copper foils on both sides is used as a base member, and the photoetching technique is used to form an antenna conductor on this (for example, see patent document 1: JP-A-H05-347509, and patent document 2: JP-A-2002-118411).

The patent document 1 discloses a printed antenna in which an antenna conductor layer including at least a loop-shaped conductor part is formed by using an upper side copper foil of a both-sided substrate, an earth conductor layer is formed by using a lower side copper foil, and an insulating material part between the upper and lower copper foils of the both-sided substrate is used as a dielectric layer. In this printed antenna, a feed part is formed of the copper foil at the side of the earth conductor layer while being insulated from this earth conductor layer, and the loop-shaped conductor part of the antenna conductor layer and the earth conductor layer are connected to each other by a grounding conductor through the dielectric layer. Besides, in this printed antenna, a feeding conductor is made to face the inside of the loop-shaped conductor from the feed part through the dielectric layer, and a series resonant circuit including an inductance element and a capacitor element to cancel reactance of an antenna body part and to broaden the band width is provided between the feeding conductor and the loop-shaped conductor. The patent document 1 describes that by constructing the printed antenna as stated above, the band width can be broadened by using the reactance compensation method, the total combination adjustment after manufacture can be made unnecessary, and a drop in antenna gain can be reduced.

The patent document 2 discloses a helical antenna in which plural through holes are formed alternately in parallel on a printed-circuit board, and ends of these through holes are connected so as to form a spiral as a whole. This patent document 2 describes that a small antenna element for a mobile communication unit can be provided by constructing the helical antenna as stated above.

By the way, in recent years, in the development of an equipment, including a mobile communication unit, for performing wireless communication, importance is attached to miniaturization. Here, consideration will be given to a case where an antenna element is mounted on a printed-circuit board.

The antenna element is mounted through solder or the like on the printed-circuit board on which one or plural modules, such as an RF (Radio Frequency) module, for realizing the function of an equipment body are mounted. Specifically, as shown in a cross-sectional view of FIG. 1, a terminal 210' of an antenna conductor 210 connected to a power supply 200 is directly welded to a printed-circuit board 220 indicated as broken line parts in the drawing so that an antenna element is mounted on the printed-circuit board 220.

Here, the characteristic of the antenna element can be expressed by a resonant frequency f indicated in a following expression (1). Incidentally, in the following expression (1), L denotes inductance, C denotes capacitance, and $\pi$ denotes the circular constant.

$$f=1/(2\pi(LC)^{1/2}) \qquad (1)$$

Besides, in the antenna element, in the case where the terminal 210' where a maximum voltage is generated is provided in the vicinity of a ground, since a stray capacitance C' is generated, a resonant frequency f' becomes as indicated by a following expression (2). In the antenna element, it is known that the resonant frequency is changed due to the stray capacitance C', and in accordance with this, the impedance is changed.

$$f=1/(2\pi(L(C+C'))^{1/2}) \qquad (2)$$

Here, there is a problem that the antenna element is apt to be influenced by a ground existing in the surroundings, and the characteristic is changed by the existence of the ground. That is, in an equipment for performing wireless communication, for example, like an electrode for grounding, in the case where another metal body 230, as part of various modules, mounted on the printed-circuit board 220 exists to be close to the antenna element, a specified capacitance is eventually generated between the terminal 210' and the metal body 230. Accordingly, in the equipment for performing wireless communication, the resonant frequency is changed by the occurrence of variation in distance between the terminal 210' and the metal body 230, and an expected antenna characteristic can not be obtained, and a situation occurs in which the operation is performed as if an antenna element having another characteristic is mounted.

In order to avoid such a problem, in an equipment for performing wireless communication, in general, it has been necessary to design a layout on a printed-circuit board so that the ground, that is, another metal body is not provided in the surrounding area of a place where the antenna element is mounted. In other words, in the equipment for performing wireless communication, for example, as shown in FIG. 2, in order to mount an antenna element 250, it is necessary that a dedicated land 260 in which a ground required by other modules indicated as oblique line parts in the drawing does not exist is provided on a printed-circuit board 270, and the antenna element 250 itself is also designed on the assumption that the ground does not exist in the surroundings. This prevents miniaturization of the equipment, and means that the degree of freedom in the layout on the printed-circuit board is extremely restricted.

DISCLOSURE OF THE INVENTION

The invention has been made in view of such circumstances and an object thereof is to provide an antenna mounting printed-circuit board which mounts thereon an antenna element that is not easily influenced by a ground existing in the surroundings, rather, actively uses the ground existing in the surroundings to perform matching, and can realize excellent directivity, and which accelerates miniaturization of an equipment, and can greatly increase the degree of freedom in layout.

In order to achieve the above object, an antenna mounting printed-circuit board of the invention is incorporated in an equipment having at least a communication function, and is an antenna mounting printed-circuit board on which various modules for realizing various functions are mounted, and is characterized in that a chip-like antenna element in which an open end is formed by at least two antenna conductors separated from each other is mounted, and a ground required by one or plural other modules is disposed and mounted so as to surround a remaining area of a surrounding area of the antenna element except a partial area.

The antenna mounting printed-circuit board of the invention as stated above mounts thereon the antenna element in which the open end is formed by at least the two antenna conductors separated from each other, so that a relatively large capacitance can be generated at the open end. Thus, in the antenna mounting printed-circuit board of the invention, since the variation in resonant frequency of the antenna element can be suppressed to such a degree that it can be neglected, resistance to the influence of a ground existing in the surroundings can be made very high, rather, it becomes possible to dispose a ground in a vicinity and to use the ground to perform matching. Then, in the antenna mounting printed-circuit board of the invention, the ground is disposed so as to surround the remaining area of the surrounding area of the antenna element except the partial area, so that the directivity of the antenna element can be controlled in a specified direction.

Besides, the antenna mounting printed-circuit board of the invention is characterized in that the antenna element is constructed such that a conductor pattern having a three-dimensional structure is formed on a specified resin substrate.

According to the antenna mounting printed-circuit board of the invention as stated above, since the conductor pattern of the antenna element is made to have the three-dimensional structure, even in the case where the antenna element is constructed by using a substrate having a low dielectric constant, the substrate does not become large, and narrowing of a band width can also be avoided. Besides, the antenna mounting printed-circuit board can also resolve the problem that the impedance is lowered due to the occurrence of the capacitance at the open end of the antenna element.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings.

FIG. 10A is contour map for explaining the state of a radiation electric field obtained by the simulation using the printed-circuit board shown in FIGS. 9A and 9B, in which corresponds to FIG. 9A and is the contour map of the radiation electric field at the time when the printed-circuit board is viewed from above.

FIG. 12 is a plan view of a partial area in a printed-circuit board formed of a layout different from the printed-circuit board shown in FIG. 7.

FIG. 13 is a plan view of an antenna element in which a conductor pattern different from the conductor pattern shown in FIG. 5 is formed.

FIG. 16 is a bottom view of the antenna element shown in FIG. 15.

DETAILED DESCRIPTION OF THE INVENTION

Hereinafter, a specific embodiment to which the invention is applied will be described in detail with reference to the drawings.

The embodiment is a printed-circuit board which is incorporated in the inside of an equipment having at least a communication function, for example, a mobile communication unit such as a cellular phone, or a wireless LAN (Local Area Network) according to the so-called IEEE (Institute of Electronic and Electronics Engineers) 802.11 standard, and mounts thereon a chip-like antenna element called a printed antenna in which an antenna conductor is patterned and formed on a specified resin substrate as a base member. This printed-circuit board mounts thereon one or plural other modules for realizing functions of an equipment body, together with the printed antenna, and mounts thereon the printed antenna which is not easily influenced by a ground existing in the surroundings, rather, actively uses the ground existing in the surroundings to perform matching, and realizes excellent directivity. By this, this printed-circuit board accelerates miniaturization of the equipment, and can greatly increase the degree of freedom in layout.

First, prior to the explanation of the details of the printed-circuit board, the printed antenna mounted on the printed-circuit board will be described with reference to FIGS. 3 to 6. Incidentally, in the following, in order to differentiate a printed-circuit board on which other modules for realizing the functions of an equipment body, together with a printed antenna, are mounted from a printed-circuit board used as a base member of a printed antenna, the printed-circuit board used as the base member of the printed antenna will be merely referred to as a substrate and the description will be made.

A printed antenna 10 can be constructed by using any kind of base member as long as it is generally used as a base member of a printed-circuit board. Specifically, the printed antenna 10 is constructed by using a so-called rigid substrate having copper foils at both sides, such as a paper phenol substrate defined by symbol XXP, XPC or the like according to National Electrical Manufacturers Association (NEMA), a paper polyester substrate defined by symbol FR-2, a paper epoxy substrate defined by symbol FR-3, a glass paper composite epoxy substrate defined by symbol CEM-1, a glass unwoven composite epoxy substrate defined by symbol CHE-3, a glass cloth epoxy substrate defined by symbol G-10, or a glass cloth epoxy substrate defined by symbol FR-4. Incidentally, among these, the glass cloth epoxy substrate (FR-4) having less hygroscopicity, less change in size, and self-antiinflammatory is most desirable.

Figure 1:
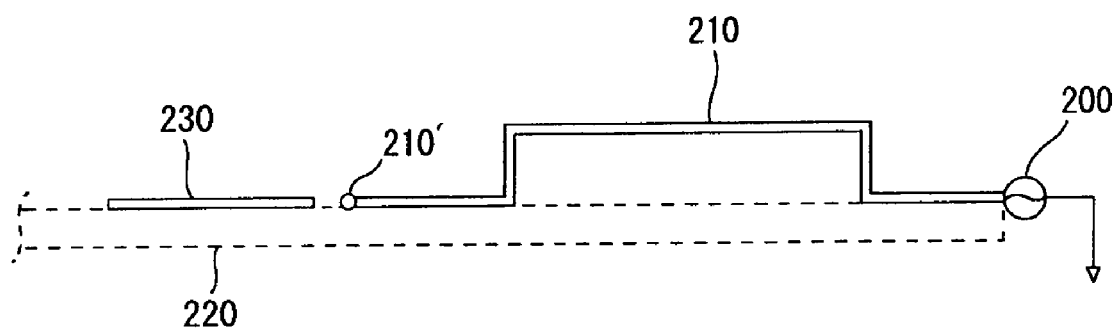
FIG. 1 is a cross-sectional view of a conventional antenna element and is a view for explaining a state in which it is mounted on a printed-circuit board.
Figure 2:
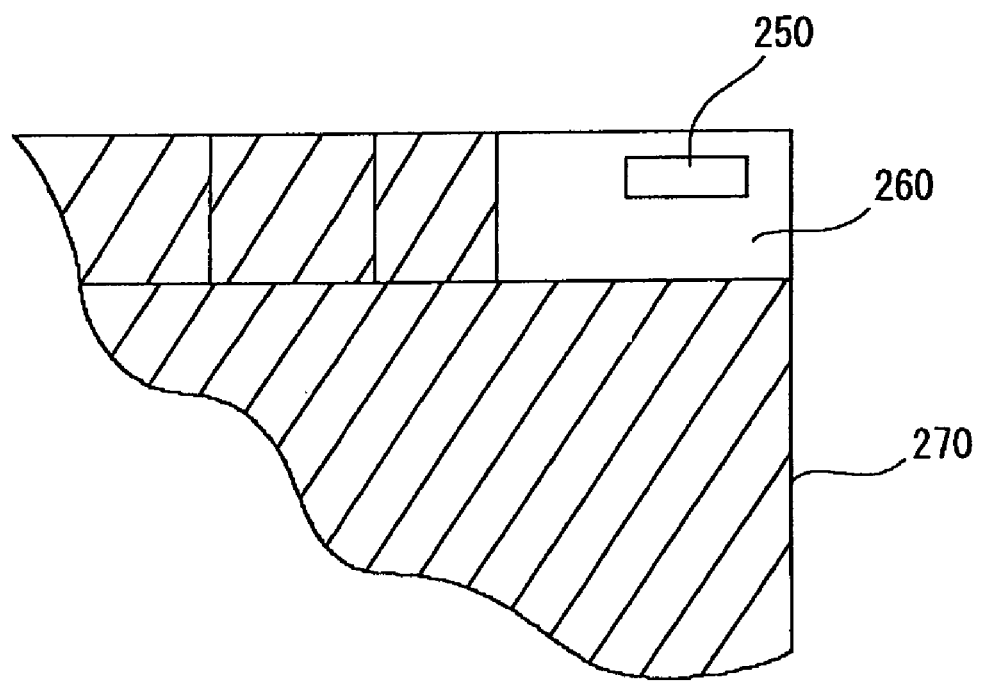
FIG. 2 is a plan view of a partial area of the conventional printed-circuit board on which the conventional antenna element is mounted.
Figure 3:
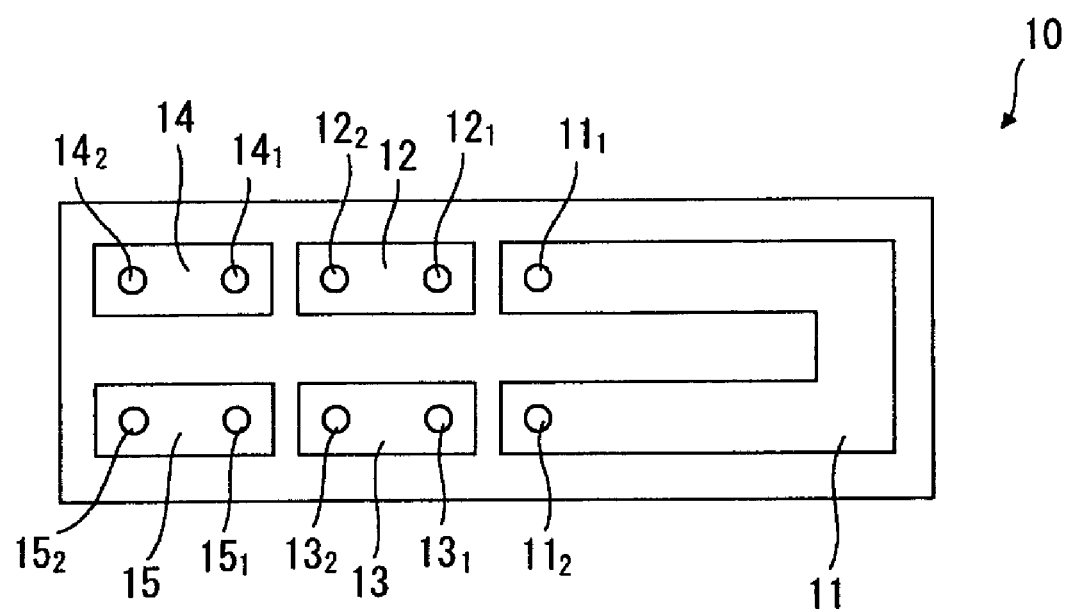
FIG. 3 is a plan view of a printed antenna to be mounted on a printed-circuit board of an embodiment of the invention.
Figure 4:
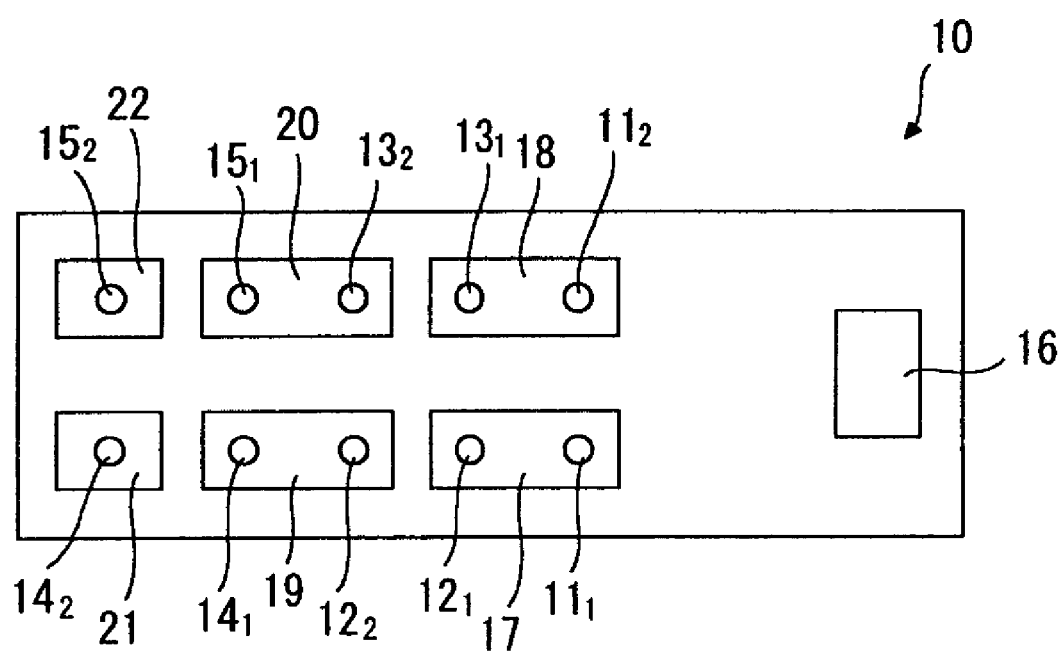
FIG. 4 is a bottom view of the printed antenna.

As shown in a plan view of FIG. 3, the printed antenna 10 is constructed such that a rectangular thin plate substrate having a section of, for example, 3 mm×8.8 mm is etched, so that plural antenna conductors 11, 12, 13, 14 and 15 as radiation electrodes are formed to be exposed on the front surface of the substrate. Specifically, in the printed antenna 10, the substantially C-shaped antenna conductor 11 and the rectangular antenna conductors 12, 13, 14 and 15 are formed on the substrate. Besides, as shown in a bottom view of FIG. 4, the printed antenna 10 is constructed such that plural rectangular antenna conductors 16, 17, 18, 19, 20, 21 and 22 as radiation electrodes are formed to be exposed on the back surface of the substrate. Among these, the antenna conductor 21 is used as a feeding electrode, and the antenna conductor 22 is used as a grounding electrode.

Further, in the printed antenna 10, plural through holes $11_1$, $11_2$, $12_1$, $12_2$, $13_1$, $13_2$, $14_1$, $14_2$, $15_1$ and $15_2$ the insides of which are plated with copper foils are provided to pierce the substrate from the front surface thereof to the back surface. Specifically, in the printed antenna 10, the through holes $11_1$, $12_1$, $12_2$, $14_1$ and $14_2$ are bored in one line at substantially regular intervals, the through holes $11_2$, $13_1$, $13_2$, $15_1$ and $15_2$ are bored in one line at substantially regular intervals, and a through hole group including the through holes $11_1$, $12_1$, $12_2$, $14_1$ and $14_2$ and a through hole group including the through holes $11_2$, $13_1$, $13_2$, $15_1$ and $15_2$ are arranged in parallel to each other.

Then, the through hole $11_1$ is bored such that one end of the antenna conductor 11 provided on the front surface side of the substrate is made a starting point, and one end of the antenna conductor 17 provided on the back surface side is made an end point, and the through hole $11_2$ is bored such that the other end of the antenna conductor 11 is made a starting point, and one end of the antenna conductor 18 provided on the back surface side is made an end point. Besides, the through hole $12_1$ is bored such that one end of the antenna conductor 12 provided on the front surface side of the substrate is made a starting point, and the other end of the antenna conductor 17 is made an end point, and the through hole $12_2$ is bored such that the other end of the antenna conductor 12 is made a starting point, and one end of the antenna conductor 19 provided on the back surface side is made an end point. Besides, the through hole $13_1$ is bored such that one end of the antenna conductor 13 provided on the front surface side of the substrate is made a starting point, and the other end of the antenna conductor 18 is made an end point, and the through hole $13_2$ is bored such that the other end of the antenna conductor 13 is made a starting point, and one end of the antenna conductor 20 provided on the back surface side is made an end point. Besides, the through hole $14_1$ is bored such that one end of the antenna conductor 14 provided on the front surface side of the substrate is made a starting point, and the other end of the antenna conductor 19 is made an end point, and the through hole $14_2$ is bored such that the other end of the antenna conductor 14 is made a starting point, and one end of the antenna conductor 21 provided on the back surface side is made an end point. Besides, the through hole $15_1$ is bored such that one end of the antenna conductor 15 provided on the front surface side of the substrate is made a starting point, and the other end of the antenna conductor 20 is made an end point, and the through hole $15_2$ is bored such that the other end of the antenna conductor 15 is made a starting point, and one end of the antenna conductor 22 provided on the back surface side is made an end point.

In other words, in the printed antenna 10, the antenna conductors 11 and 17 are connected to each other to enable electrical conduction through the through hole $11_1$, and the antenna conductors 11 and 18 are connected to each other to enable electrical conduction through the through hole $11_2$. Besides, in the printed antenna 10, the antenna conductors 12 and 17 are connected to each other to enable electrical conduction through the through hole $12_1$, and the antenna conductors 12 and 19 are connected to each other to enable electrical conduction through the through hole $12_2$. Besides, in the printed antenna 10, the antenna conductors 13 and 18 are connected to each other to enable electrical conduction through the through hole $13_1$, and the antenna conductors 13 and 20 are connected to each other to enable electrical conduction through the through hole $13_2$. Further, in the printed antenna 10, the antenna conductors 14 and 19 are connected to each other to enable electrical conduction through the through hole $14_1$, and the antenna conductors 14 and 21 are connected to each other to enable electrical conduction through the through hole $14_2$. Besides, in the printed antenna 10, the antenna conductors 15 and 20 are connected to each other to enable electrical conduction through the through hole $15_1$, and the antenna conductors 15 and 22 are connected to each other to enable electrical conduction through the through hole $15_2$. Accordingly, the printed antenna 10 is constructed such that the antenna conductors 11, 12, 13, 14, 15, 17, 18, 19, 20, 21 and 22 are connected to one another to enable electrical conduction.

Figure 5:
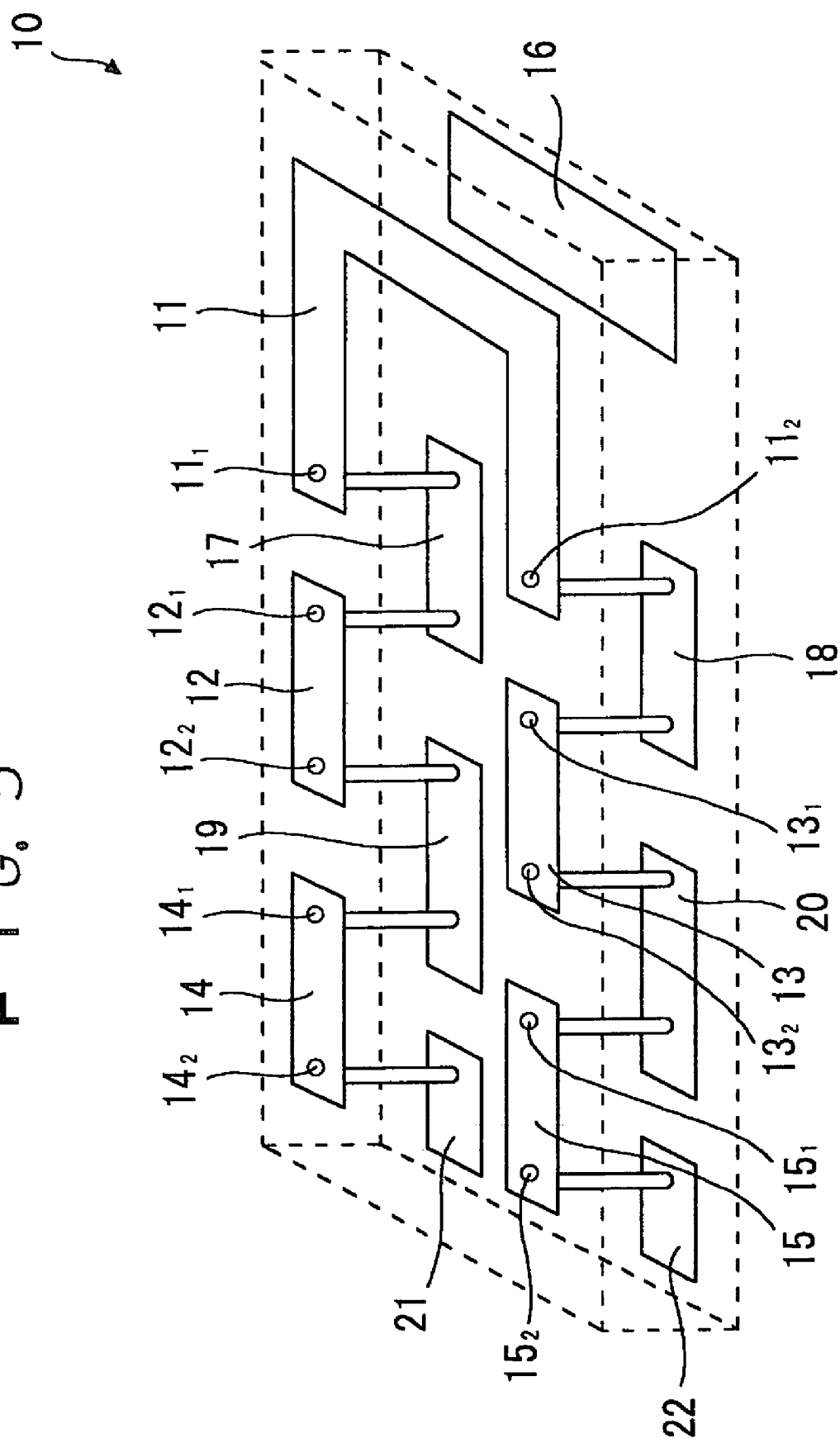
FIG. 5 is a perspective view for explaining a conductor pattern of the printed antenna in the inside of a substrate.
Figure 6:
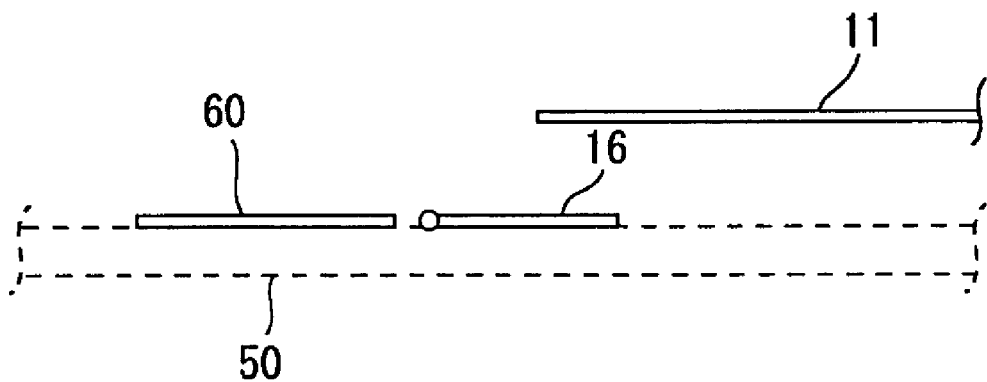
FIG. 6 is a cross-sectional view of the printed antenna and is a view for explaining an open end formed of two antenna conductors.

More specifically, as shown in FIG. 5 showing the inside of the substrate, the printed antenna 10 is constructed by forming a series of conductor patterns such that the plural antenna conductors 11, 12, 13, 14, 15, 17, 18, 19, 20, 21 and 22 connected in a meandering shape (comb teeth shape) through the plural through holes $11_1$, $11_2$, $12_1$, $12_2$, $13_1$, $13_2$, $14_1$, $14_2$, $15_1$ and $15_2$ are bent into substantially a C-shape with the antenna conductor 11 as the center.

In general, in the case where an antenna element is constructed by using a substrate having a low dielectric constant, in order to secure gain, a long conductor pattern must be formed in view of the influence of ground existing in the surroundings, and the antenna element becomes large in accordance with this. On the other hand, in the printed antenna 10, the conductor pattern having the three-dimensional structure is formed, so that the impedance can be increased up to such a value that the antenna can withstand the influence of the ground existing in the surroundings. Accordingly, the printed antenna 10 can be greatly miniaturized and made thin, and can also avoid the narrowing of the band width.

In the printed antenna 10 as stated above, the antenna conductors 11 and 16 are disposed to be separated from each other, so that an open end is formed. Specifically, in the printed antenna 10, as shown in a cross-sectional view of FIG. 6, the antenna conductor 16 is directly welded to a printed-circuit board 50 indicated by a broken line in the drawing through solder or the like, and the antenna conductor 11 is provided to be separated from the antenna conductor 16 in a height direction by the thickness of the substrate. By this, in the printed antenna 10, a relatively large capacitance is generated between the antenna conductors 11 and 16.

Here, in the printed antenna 10, a maximum voltage is generated at the open end formed of the antenna conductors 11 and 16, and in the case where this open end is provided in the vicinity of another metal body 60 mounted as part of various modules, such as a grounding electrode, on the printed-circuit board 50, a stray capacitance is generated.

However, in the printed antenna 10, the antenna conductors 11 and 16 are separated from each other to actively form the large capacitance, and accordingly, even if fluctuation occurs in distance between the antenna conductor 16 and the metal body 60, the variation of a resonant frequency can be suppressed to such a degree that it can be neglected. Accordingly, in the printed antenna 10, the resistance to the influence of a ground existing in the surroundings can be made very high, rather, a ground is disposed in the vicinity and this ground can be used to perform matching.

Incidentally, in the printed antenna 10, although the impedance is lowered due to the occurrence of the capacitance between the antenna conductors 11 and 16, as described above, the conductor pattern having the three-dimensional structure is formed, so that this problem can be resolved.

The printed antenna 10 as stated above is mounted on the printed-circuit board by welding the back surface side on which the antenna conductors 16, 17, 18, 19, 20, 21 and 22 are formed to be exposed, to the printed-circuit board through solder or the like.

In the following, the printed-circuit board 50 on which the printed antenna 10 as stated above is mounted will be described.

Figure 7:
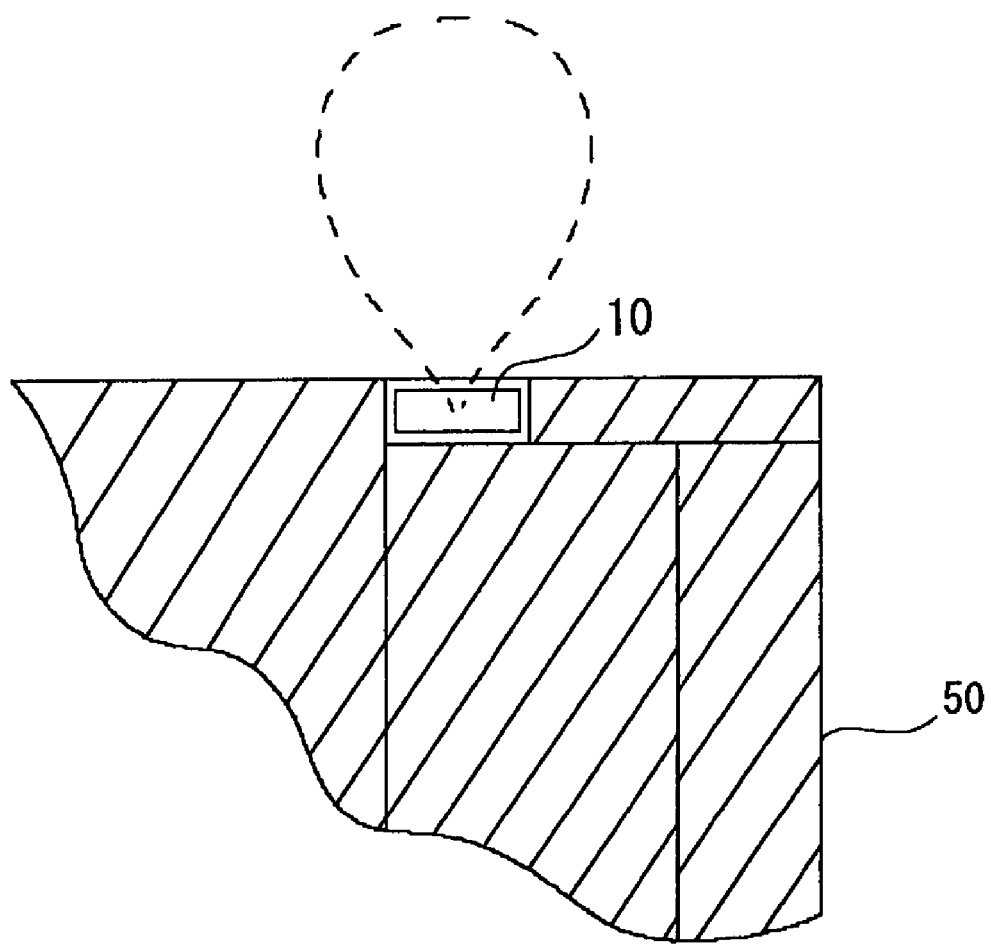
FIG. 7 is a plan view of a partial area in a printed-circuit board on which a printed antenna is mounted.

In the printed-circuit board 50, as described above, the printed antenna 10 has high resistance to the influence of the ground existing in the surroundings, rather, uses the ground to perform matching. Thus, in the printed-circuit board 50, for example, as shown in FIG. 7, the printed antenna 10 is mounted in the vicinity of a ground required by other modules indicated as oblique line parts in the drawing.

Figure 8:
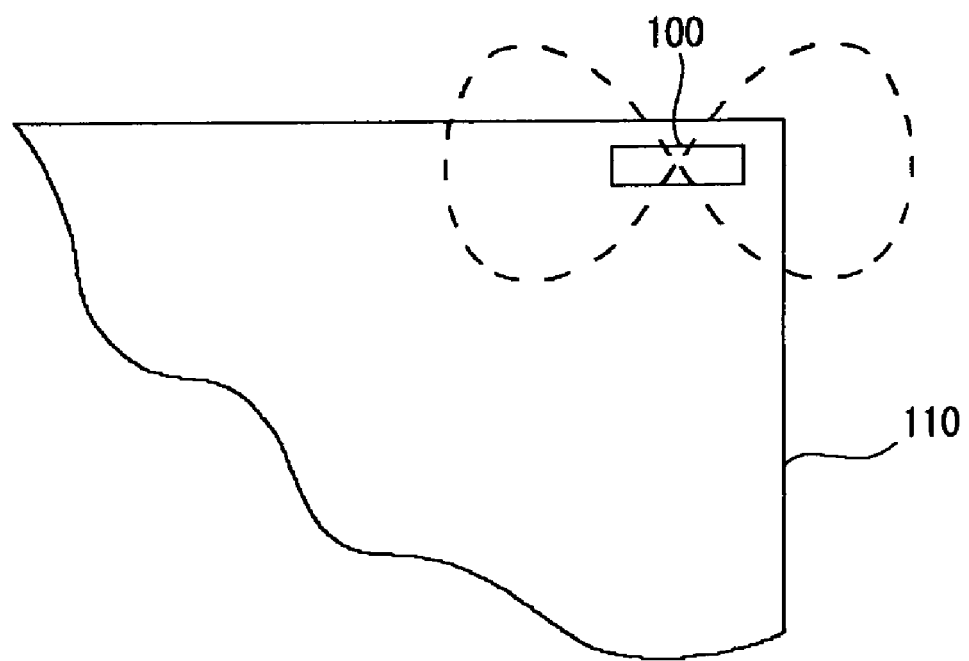
FIG. 8 is a plan view of a partial area in a conventional printed-circuit board on which a conventional antenna element is mounted and is a view for explaining the arrangement position of the antenna element on the printed-circuit board and the state of a radiation electric field at that time.

Here, consideration will be given to a case where an antenna element including a conventional printed antenna is mounted on a printed-circuit board. For example, as shown in FIG. 8, a conventional antenna element 100 is often mounted in an area close to a corner of a printed-circuit board 110 and in an area where ground does not exist in the surroundings. In this case, a radiation electric field comes to have an 8-shaped dipole mode as indicated by a broken line in the drawing. Accordingly, in the conventional antenna element 100, the half of electric power supplied is lost.

On the other hand, in the printed-circuit board 50, the ground is disposed so as to surround the remaining area of the surrounding area of the printed antenna 10 except a partial area. For example, in the printed-circuit board 50, as previously shown in FIG. 7, the ground is disposed so as to surround the surrounding area of at least three sides of the four sides forming the rectangular section in the printed antenna 10 having the section showing the rectangular shape.

In the printed-circuit board 50, in the case where the printed antenna 10 and the surrounding ground are disposed as stated above, a current flows through the antenna conductors of the printed antenna 10, so that the vicinity of an area not surrounded by the ground in the surrounding area of the printed antenna 10 is excited. For example, in the printed-circuit board 50, in the case of the arrangement shown in the drawing, among the four sides forming the rectangular section in the printed antenna 10, an edge portion of the printed-circuit board 50 facing one side not surrounded by the ground is excited. By this, in the printed-circuit board 50, the radiation electric field does not come to have a dipole mode, and as indicated by a broken line in the drawing, the radiation electric field is formed into a balloon shape and is radiated in one direction. That is, the printed-circuit board 50 can be operated so that the printed antenna 10 has directivity only in a specified direction.

Figure 9A:
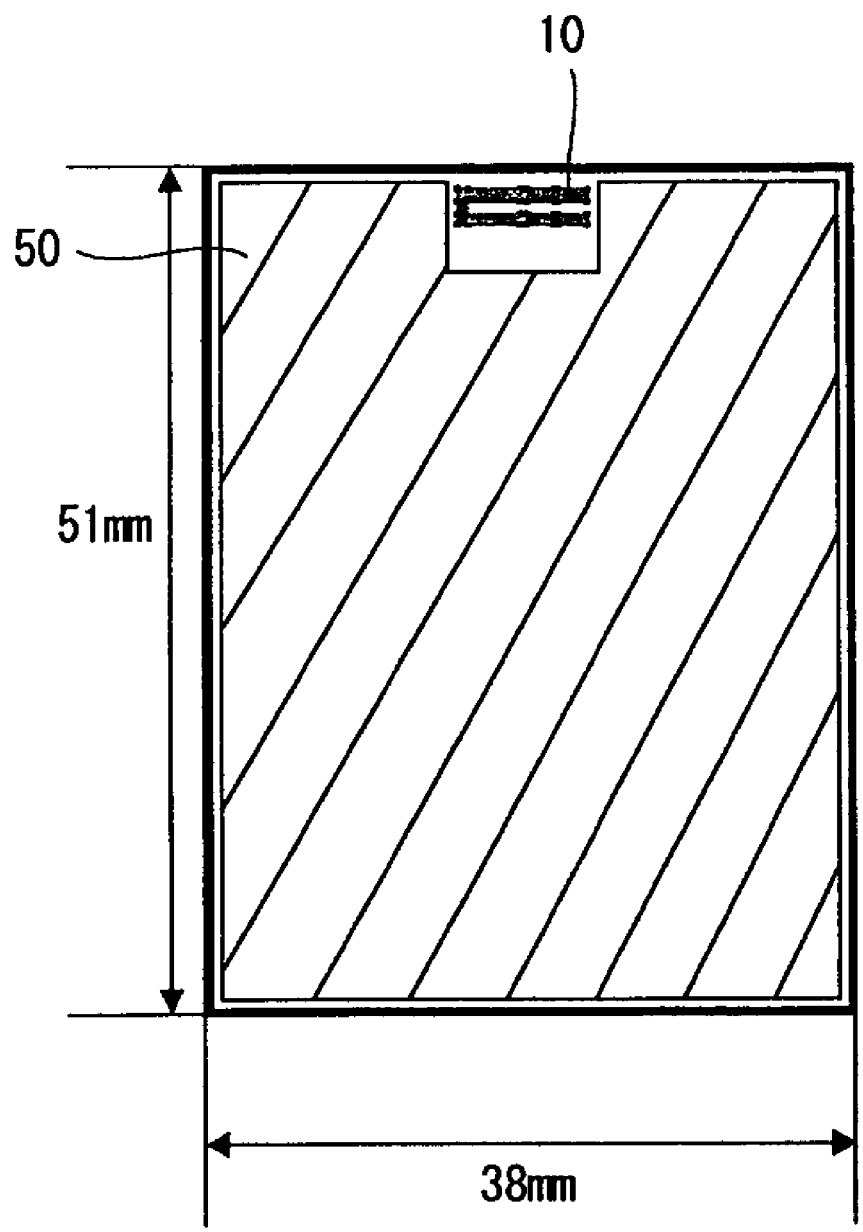
FIG. 9A is a plan view for explaining the structure of a printed-circuit board on which a printed antenna used for simulation is mounted.
Figure 9B:
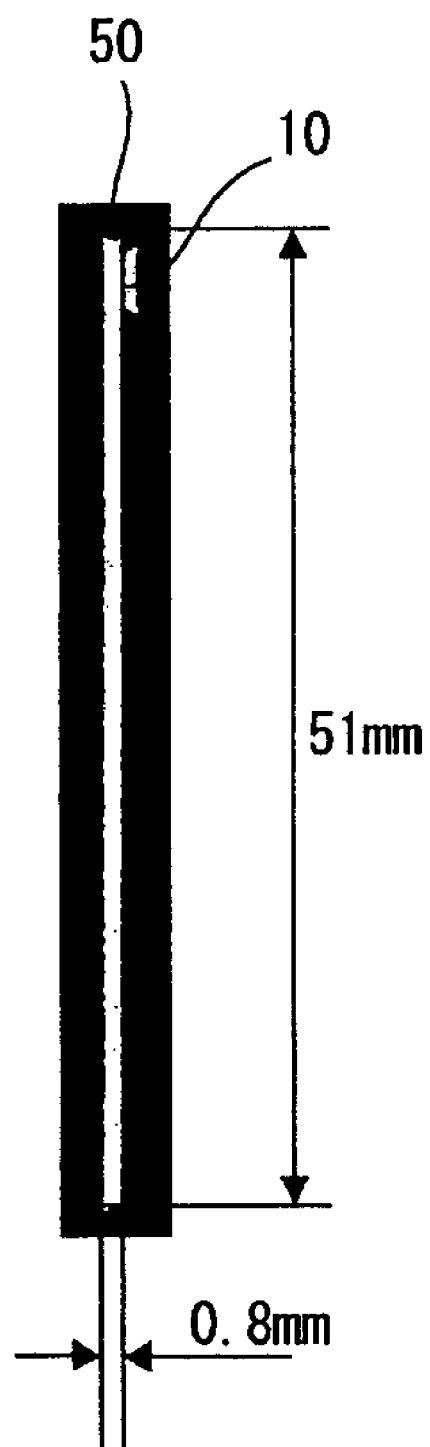
FIG. 9B is a side view for explaining the structure of a printed-circuit board on which a printed antenna used for simulation is mounted.

In order to specifically confirm the state of the directivity, the inventors carried out a simulation using a specified printed-circuit board. As shown in a plan view of FIG. 9A and a side view of FIG. 9B, the simulation was carried out using a printed-circuit board 50 whose material was FR-4 and whose shape was a thin plate shape having a size of 51 mm long×38 mm broad×0.8 mm high. Besides, in this simulation, as indicated by oblique lines in FIG. 9A, a ground was disposed on the front and back surfaces of the printed-circuit board 50 so as to surround the surrounding area of three sides among four sides forming a rectangular section in a printed antenna 10 whose section is rectangular.

Figure 10B:
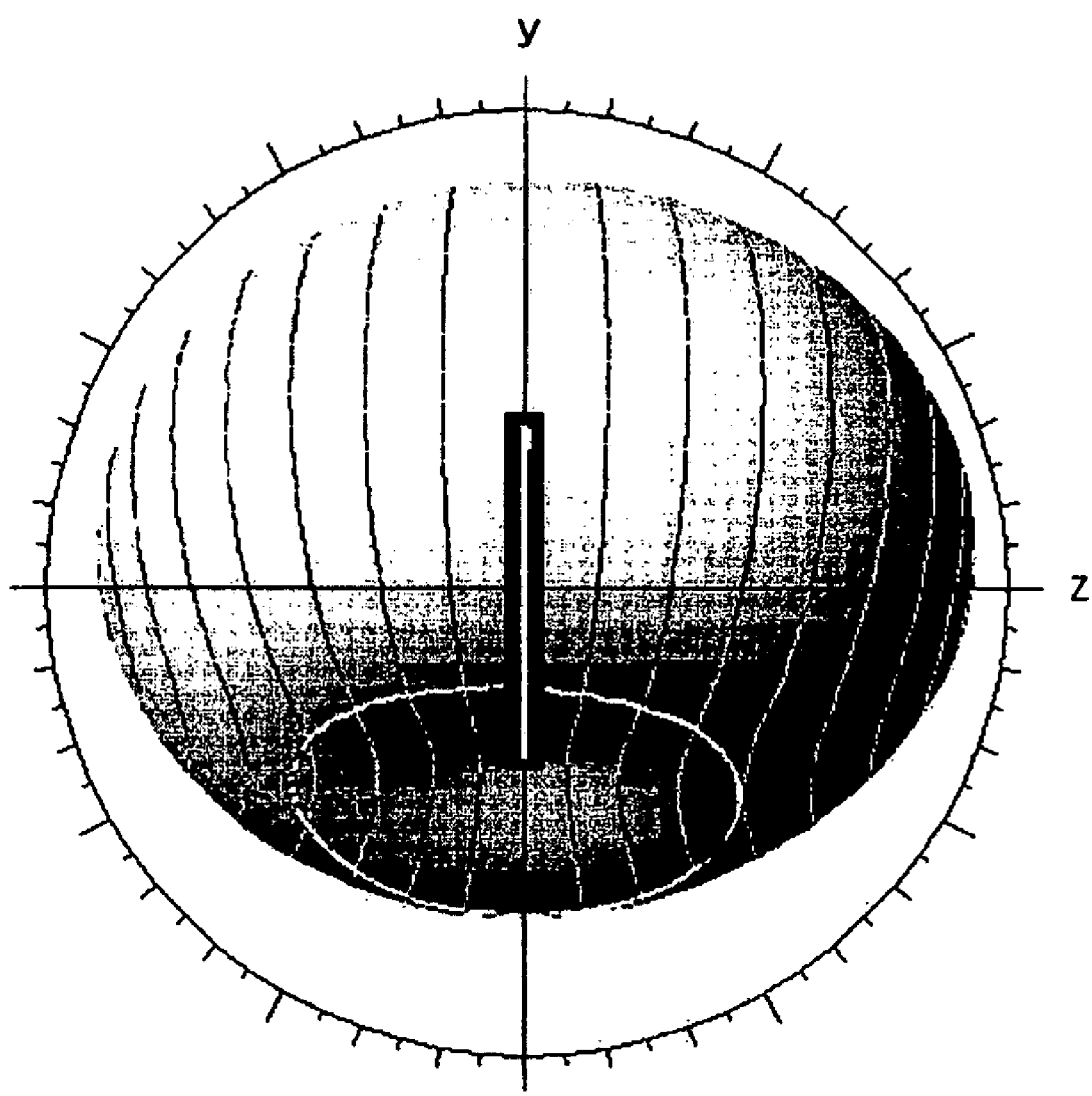
FIG. 10B is contour map for explaining the state of a radiation electric field obtained by the simulation using the printed-circuit board shown in FIGS. 9A and 9B, in which corresponds to FIG. 9B and is the contour map of the radiation electric field at the time when the printed-circuit board is viewed from side.

In this case, a contour map of radiation electric field was evaluated, and a result as shown in FIGS. 10A and 10B was obtained. Incidentally, FIG. 10A corresponds to FIG. 9A and shows the radiation electric field when the printed-circuit board 50 is viewed from above, and FIG. 10B corresponds to FIG. 9B and shows the radiation electric field when the printed-circuit board 50 is viewed from side. Besides, in FIGS. 10A and 10B, the horizontal direction of the printed-circuit board 50 is an x-axis, the vertical direction is a y-axis, and the thickness direction is a z-axis.

From the drawings, it is understood that the radiation electric field is apparently different from the 8-shaped dipole mode, and is formed into a balloon shape expanding in the +y direction on the x-y plane while the printed-circuit board 50 is made a radiation source. Incidentally, from this result, a gain of about 2.06 dBi was obtained. For example, in the case where the printed-circuit board 50 is applied to a LAN card, although the −x direction becomes a loss direction, since it is small as compared with the +y direction, it is understood that the printed-circuit board 50 efficiently uses the electric power supplied.

Figure 11:
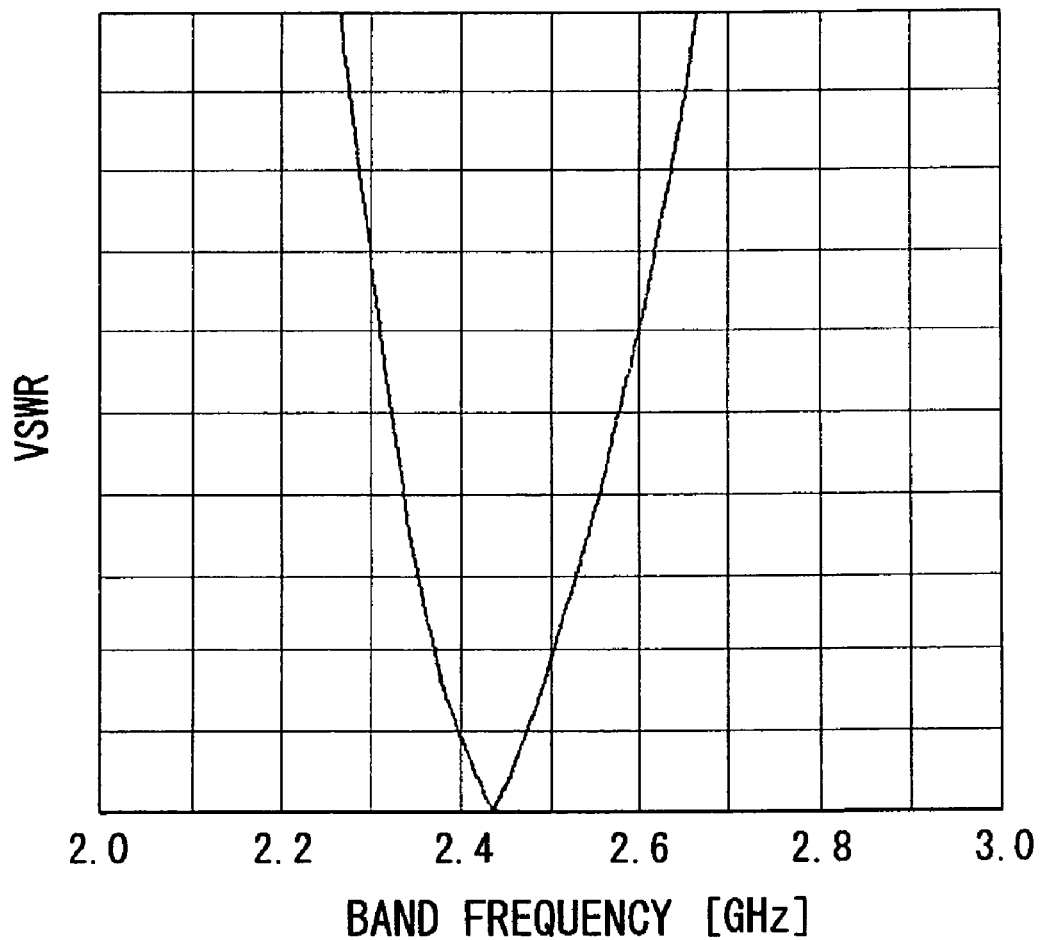
FIG. 11 is a view for explaining a characteristic of a voltage standing wave ratio with respect to a band frequency obtained by the simulation using the printed-circuit board shown in FIGS. 9A and 9B.

Besides, a voltage standing wave ratio (VSWR) with respect to a band frequency at this time was evaluated, and a result as shown in FIG. 11 was obtained. Incidentally, in the drawing, the vertical axis indicates the voltage standing wave ratio and the horizontal axis indicates the band frequency.

From the drawing, it is understood that the voltage standing wave ratio has the highest efficiency at a band frequency of about 2.44 GHz, and has a characteristic folded back at this band frequency as the center. Besides, the effective bandwidth at this time became about 131.72 MHz. From this, it can be said that the printed-circuit board 50 on which the printed antenna 10 used in this simulation is mounted is very effective when applied to a wireless LAN according to the IEEE 802.11b standard utilizing the band of 2.4 GHz.

As stated above, in the printed-circuit board 50, the ground is disposed so as to surround the remaining area of the surrounding area of the printed antenna 10 except the partial area, so that a large loss of electric power supplied to the printed antenna 10 can be avoided and the electric power can be effectively used, and further, excellent directivity can be realized, and sensitivity can be raised.

As described above, in the printed-circuit board 50 shown as the embodiment of the invention, the printed antenna 10 in which the open end is formed of the two antenna conductors 11 and 16 is mounted, so that the printed antenna 10 is not easily affected by the ground existing in the surroundings, rather, can be handled as one actively using the ground existing in the surroundings to perform matching. Thus, in the printed-circuit board 50, at the design stage of a layout, it is not necessary to provide a dedicated land in which a ground required by another module does not exist, and a flexible layout becomes possible. Besides, in the printed-circuit board 50, the ground is disposed so as to surround the remaining area of the surrounding area of the printed antenna 10, in which the open end as stated above is formed, except the partial area, so that excellent directivity can be realized.

Accordingly, the printed-circuit board 50 can accelerate the miniaturization of an equipment, can greatly increase the degree of freedom in layout, and is particularly effective when applied to an equipment, such as a cellular phone, in which the design and power restriction is severe. As stated above, the printed-circuit board 50 on which the printed antenna 10 is mounted eliminates the necessity to provide a dedicated land in which a ground required by another module does not exist, and also concerning the antenna element itself, it becomes unnecessary to design on the assumption that a ground does not exist in the surroundings, and a quite new concept in design guidelines is proposed.

Besides, in the printed-circuit board 50, since the printed antenna using the inexpensive printed-circuit board as the base member is mounted, the processing of the antenna element is easy, and it becomes possible to manufacture the antenna element by using the manufacture process of the printed-circuit board 50, and the total manufacture cost can be greatly reduced.

Incidentally, the invention is not limited to the foregoing embodiment. For example, in the foregoing embodiment, although the description has been given of the case where the printed antenna is used as the antenna element, the invention is not limited to the printed antenna, but can be applied to any antenna as long as the antenna is a chip-like antenna element which can be surface-mounted to a printed-circuit board.

Besides, in the foregoing embodiment, although the description has been given of the case where the section of the printed antenna shows the rectangular shape, and in this case, the ground is disposed so as to surround the surrounding area of the three sides of the four sides forming the rectangular section in the printed antenna, in the invention, in the case where the section of the antenna element shows the rectangular shape, for example, as indicated by an oblique line part in FIG. 12, a printed-circuit board may be such that the ground is disposed so as to surround the surrounding area of a part of a remaining one side in addition to the surrounding area of three sides of four sides forming a rectangular section in an antenna element 70. And the invention can be applied to any arrangement as long as a ground is disposed so as to surround a remaining area of a surrounding area of an antenna element except a partial area.

Further, in the foregoing embodiment, although the description has been given of the example in which the arrangement position of the printed antenna on the printed-circuit board is close to the edge of the printed-circuit board, in the invention, it is not necessary that the position is close to the edge of the printed-circuit board, and as long as a ground is disposed so as to surround a remaining area of a surrounding area of an antenna element except a partial area, even if the ground is disposed on any area on the printed-circuit board, the same directivity can be obtained.

Further, in the foregoing embodiment, although the description has been given of the printed antenna in which the series of conductor patterns are formed such that the plural antenna conductors connected into the meandering shape (comb teeth shape) through the plural through holes are bent into substantially the C-shape, in the invention, as the conductor pattern of the antenna element, any pattern can be applied under the condition that matching to the surrounding ground is suitably performed.

Figure 14:
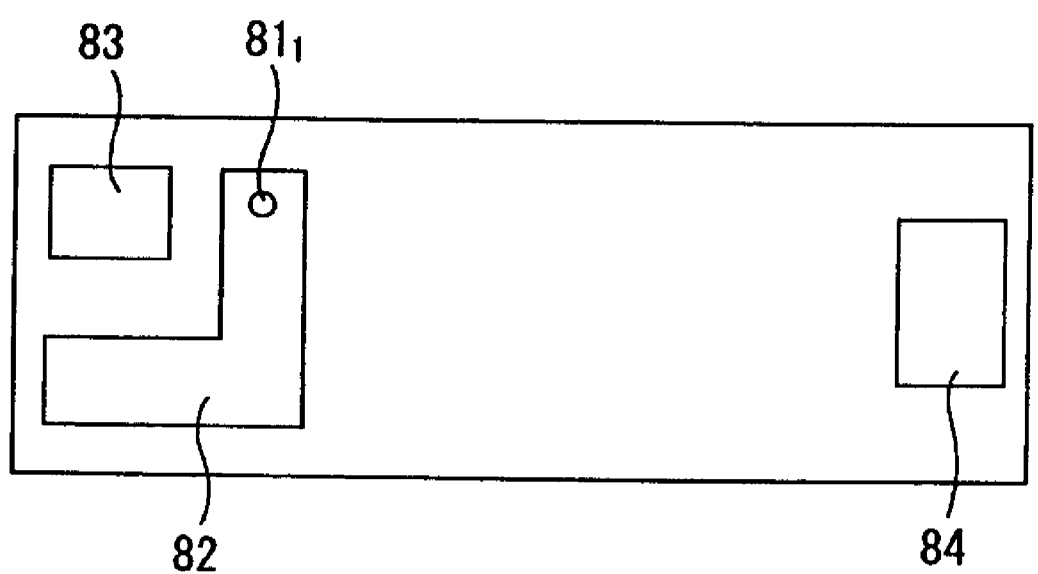
FIG. 14 is a bottom view of the antenna element shown in FIG. 13.

For example, the antenna element maybe such that as shown in a plan view of FIG. 13, an antenna conductor 81 is formed to be exposed on the front surface of a substrate, and as shown in a bottom view of FIG. 14, antenna conductors 82, 83 and 84 are formed to be exposed on the back surface of the substrate, and the antenna conductors 81 and 82 are connected to each other to enable electrical conduction through a through hole $81_1$ provided to pierce the substrate from the front surface thereof to the back surface, so that a series of conductor patterns are formed. In this antenna element, an open end is formed of the antenna conductors 81 and 84, and a capacitance is generated in this portion.

Figure 15:
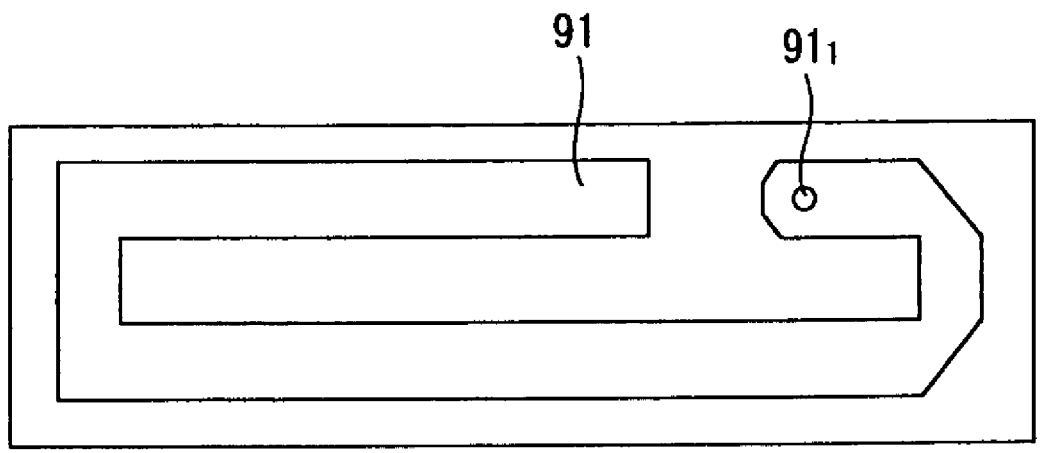
FIG. 15 is a plan view of an antenna element in which a conductor pattern different from the conductor pattern shown in FIG. 5 or 13 is formed.

Besides, an antenna element may be such that for example, as shown in a plan view of FIG. 15, an antenna conductor 91 is formed to be exposed on the front surface of a substrate, and as shown in a bottom view of FIG. 16, antenna conductors 92, 93, 94 and 95 are formed to be exposed on the back surface of the substrate, and the antenna conductors 91 and 92 are connected to each other to enable electrical conduction through a through hole 91, provided to pierce the substrate from the front surface thereof to the back surface, so that a series of conductor patterns are formed. In this antenna element, an open end is formed of the antenna conductors 91 and 95, and a capacitance is generated in this portion.

Further, an antenna element may be such that although not shown, a multi-layer substrate is used and a specified conductor pattern including an open end is formed.

In any case, as an antenna element, any element may be used as long as an open end is formed of at least two antenna conductors separated from each other under the condition that matching to the surrounding ground is suitably performed, and more desirably, any element may be used as long as a conductor pattern showing a three-dimensional structure is formed. Besides, at this time, as an antenna element, an open end is not formed by at least two antenna conductors disposed to be separated from each other in the height direction, but may be formed of two antenna conductors which are disposed to have the same height and to be separated from each other on the plane.

As stated above, it is needless to say that the invention can be suitably modified within the scope not deviating the gist. Specific embodiments of an antenna mounting printed circuit board according to the present invention have been described for the purpose of illustrating the manner in which the invention may be made and used. It should be understood that implementation of other variations and modifications of the invention and its various aspects will be apparent to those skilled in the art, and that the invention is not limited by the specific embodiments described. It is therefore contemplated to cover by the present invention any and all modifications, variations, or equivalents that fall within the true spirit and scope of the basic underlying principles disclosed and claimed herein.

What is claimed is:

1. An antenna mounting printed-circuit board for incorporation into equipment having at least a communication function, said printed-circuit board adapted to mount various modules thereon, comprising:
    a chip-like antenna element formed into a shape having a rectangular horizontal cross section and having an open end formed of at least two antenna conductors separated from each, said antenna element adapted for mounting on the printed-circuit board;
    a ground utilized by one or more of said various modules and arranged so as to surround a surrounding area of at least three of four sides to form the rectangular horizontal cross section in the antenna element, and
    wherein the antenna element is mounted on a substantially central position of an arbitrarily selected side of the antenna mounting printed-circuit board.

2. The antenna mounting printed-circuit board according to claim 1, wherein said at least two antenna conductors are separated from each other in a height direction.

3. The antenna mounting printed-circuit board according to claim 1, wherein the antenna element is constructed with a conductor pattern having a three-dimensional structure formed on a resin substrate.

4. The antenna mounting printed-circuit board according to claim 3, wherein the conductor pattern in the antenna element is formed by connecting the at least two antenna conductors to each other to permit electrical conductivity through one or more through holes, said through holes configured to pierce the resin substrate from a front surface to a back surface and having inside portions plated with copper foil.

5. The antenna mounting printed-circuit board according to claim 4, wherein the conductor pattern in the antenna element is formed by connecting the at least two antenna conductors in a meandering pattern via the through holes.

* * * * *